(12) United States Patent
Crawford et al.

(10) Patent No.: US 11,169,214 B2
(45) Date of Patent: *Nov. 9, 2021

(54) BATTERY SYSTEM MANAGEMENT THROUGH NON-LINEAR ESTIMATION OF BATTERY STATE OF CHARGE

(71) Applicant: Battelle Memorial Institute, Richland, WA (US)

(72) Inventors: Alasdair James Crawford, Richland, WA (US); Vilayanur Venkataraman Viswanathan, Richland, WA (US); Patrick Joseph Balducci, West Linn, OR (US); Trevor D. Hardy, Richland, WA (US); Di Wu, Richland, WA (US); Michael C. W. Kintner-Meyer, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 172 days.

This patent is subject to a terminal disclaimer.

(21) Appl. No.: 16/714,500

(22) Filed: Dec. 13, 2019

(65) Prior Publication Data

US 2020/0127474 A1    Apr. 23, 2020

Related U.S. Application Data

(63) Continuation of application No. 15/395,389, filed on Dec. 30, 2016, now Pat. No. 10,547,180.
(Continued)

(51) Int. Cl.
*H02J 7/00*  (2006.01)
*G01R 31/367*  (2019.01)
(Continued)

(52) U.S. Cl.
CPC ........... *G01R 31/367* (2019.01); *G05B 19/05* (2013.01); *G05B 23/0294* (2013.01);
(Continued)

(58) Field of Classification Search
CPC .... G01R 31/367; G01R 31/36; G01R 31/382; G01R 31/3647; H02J 7/00036;
(Continued)

(56) References Cited

U.S. PATENT DOCUMENTS 6,388,447 B1 *   5/2002   Hall ...................... H02J 7/0047
                                                              324/426
2008/0007221 A1   1/2008   Lee
(Continued)

FOREIGN PATENT DOCUMENTS

JP     2000-323182      11/2000
WO    WO 00/76018      12/2000

OTHER PUBLICATIONS

Del Rosso et al., "Energy Storage for Relief of Transmission Congestion," *IEEE Transactions on Smart Grid*, vol. 5, No. 2, pp. 1138-1146, Mar. 2014.
(Continued)

*Primary Examiner* — Zixuan Zhou
(74) *Attorney, Agent, or Firm* — Klarquist Sparkman, LLP

(57) ABSTRACT

Systems, methods, and computer media for battery system management and non-linear estimation of battery state of charge are provided herein. Battery data is received for a time period over which a battery system has operated. The battery data represents the actual performance of the battery system over the time period. Sub-periods of charging or discharging can be identified in the time period. For the sub-periods of time, a curve can be fit to the battery data. Using the curves for the battery data for the sub-periods of
(Continued)

time, an expected performance of the battery system, over a range of states-of-charge, can be determined. Operating instructions for the battery system can be provided based on the expected performance.

20 Claims, 11 Drawing Sheets

Related U.S. Application Data

(60) Provisional application No. 62/417,935, filed on Nov. 4, 2016.

(51) Int. Cl.
| | |
|---|---|
| *G05B 23/02* | (2006.01) |
| *G05B 19/05* | (2006.01) |
| *G01R 31/382* | (2019.01) |
| *G01R 31/36* | (2020.01) |
| *H01M 10/42* | (2006.01) |

(52) U.S. Cl.
CPC ........ *H02J 7/0029* (2013.01); *H02J 7/00036* (2020.01); *G01R 31/36* (2013.01); *G01R 31/3647* (2019.01); *G01R 31/382* (2019.01); *G05B 2219/1137* (2013.01); *H01M 10/4257* (2013.01); *H02J 7/0048* (2020.01)

(58) Field of Classification Search
CPC .. H02J 7/0029; H02J 7/0048; G05B 23/0294; G05B 19/05; G05B 2219/1137; H01M 10/4257
USPC .......................................... 320/127, 128, 132
See application file for complete search history.

(56) References Cited

U.S. PATENT DOCUMENTS

| | | | |
|---|---|---|---|
| 2010/0121591 A1 | 5/2010 | Hall | |
| 2013/0043876 A1* | 2/2013 | Liu | G01R 31/3828 324/426 |
| 2013/0063074 A1 | 3/2013 | Lin et al. | |
| 2014/0032141 A1 | 1/2014 | Subbotin et al. | |
| 2016/0116547 A1 | 4/2016 | Hanyu et al. | |
| 2018/0131200 A1 | 5/2018 | Crawford et al. | |

OTHER PUBLICATIONS

Divya et al., "Battery energy storage technology for power systems—An overview," *Electric Power Sys. Research*, vol. 79, No. 4, pp. 511-520, Apr. 2009.

Dunn et al., "Electrical energy storage for the grid: A battery of choices," *Science*, vol. 334, No. 6058, pp. 928-935, Nov. 18, 2011.

Lu et al., "An Evaluation of the NaS Battery Storage Potential for Providing Regulation Service in California," in *Proc. IEEE Power Systems Conf. Expos.*, pp. 109, 2011.

International Search Report and Written Opinion for PCT/US2017/051781, dated Dec. 29, 2017, 13 pages.

Ke, et al., "Control and Size Energy Storage Systems for Managing Energy Imbalance of Variable Generation Resources," *IEEE Trans. Sustain. Energy*, vol. 6, No. 1, pp. 70-78, Jan. 2015.

Neubauer et al., "Deployment of Behind-The-Meter Energy Storage for Demand Charge Reduction," National Renewable Energy Laboratory, Tech. Rep. NREL/TP-5400-63162, Jan. 2015.

Walawaikar et al., "Economics of electric energy storage for energy arbitrage and regulation in New York," *Energy Policy*, vol. 35, No. 4, pp. 2558-2568, Apr. 2007.

Wu et al., "An Energy Storage Assessment: Using Optimal Control Strategies to Capture Multiple Services," in *Proc. IEEE Power Energy Soc. Gene. Meet.*, Jul. 2015.

Wu et al., "Economic Analysis and Optimal Sizing for behind-the-meter Battery Storage," in *Proc. IEEE Power Energy Soc. Gene. Meet.*, 5 pages, Jul. 2016.

"Powerdex," http://www.powerdexindexes.com/, 2 pages (accessed Jan. 9, 2017).

Non-Final Office Action Issued in U.S. Appl. No. 15/395,389, dated Nov. 2, 2018, 18 pages.

Final Office Action Issued in U.S. Appl. No. 15/395,389, dated Jun. 5, 2019, 13 pages.

Notice of Allowance and Fee(s) Due Issued in U.S. Appl. No. 15/395,389, dated Sep. 13, 2019, 8 pages.

\* cited by examiner 600 kW CHARGE / 520 kW DISCHARGE

BATTERY SYSTEM MANAGEMENT THROUGH NON-LINEAR ESTIMATION OF BATTERY STATE OF CHARGE

CROSS REFERENCE TO RELATED APPLICATIONS

This is a Continuation of U.S. patent application Ser. No. 15/395,389, titled "BATTERY SYSTEM MANAGEMENT THROUGH NON-LINEAR ESTIMATION OF BATTERY STATE OF CHARGE", filed Dec. 30, 2016, which application claims the benefit of U.S. Provisional Application No. 62/417,935, filed on Nov. 4, 2016, and titled "NON-LINEAR ESTIMATION OF BATTERY STATE OF CHARGE." These applications are incorporated herein by reference in their entirety.

ACKNOWLEDGMENT OF GOVERNMENT SUPPORT

This invention was made with Government support under Contract No. DE-AC05-76RL01830 awarded by the U.S. Department of Energy. The Government has certain rights in the invention.

BACKGROUND

Battery systems are playing an increasing role as energy sources in power grids. The energy available from a battery system is typically understood through a round-trip efficiency (RTE) metric, which is a product of one-way charge and discharge efficiencies. Conventional approaches of determining these metrics, however, typically rely on information about a battery system that is not always available. For example, to determine one-way efficiency for charge or discharge within a state-of-charge range at a particular temperature, DC efficiency for the battery and inverter efficiency typically must be known. Even when such information is available, conventional approaches of determining these metrics result in overly simplistic approximations that can be inaccurate, thus limiting the potential of widespread deployment of battery systems in power grids.

SUMMARY

Examples described herein relate to battery system management and battery performance modeling. In some examples, battery data is received for a time period over which a battery system has operated. The battery data represents the actual performance of the battery system over the time period. Sub-periods of charging or discharging can be identified in the time period. For the respective sub-periods of time, a curve can be fit to the battery data corresponding to the sub-period of time. Using the curves for the battery data corresponding to the respective sub-periods of time, an expected performance of the battery system, over a range of states-of-charge, can be determined. Operating instructions for the battery system can be provided based on the expected performance.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The foregoing and other objects, features, and advantages of the claimed subject matter will become more apparent from the following detailed description, which proceeds with reference to the accompanying figures.

DETAILED DESCRIPTION

Using the systems, methods, and computer-readable media described herein, the expected performance of a battery system (of known or unknown chemistry, capacity, etc.) can be accurately determined at different states of charge, operating temperatures, and/or output powers. Once an accurate expected performance is known, a battery system can be operated efficiently for given circumstances (e.g., desired output power, the battery system's current SOC, operating temperature, etc.) and can be implemented in a power grid or other environment where performing as expected is of high importance.

The described technologies provide a significant improvement in battery system management technology. The improved accuracy of the described performance models and approaches to determining expected performance allow for deployment of battery systems in the power grid at a greater scale. Grid-deployed battery systems can be used for "peak shaving" in which the battery systems are brought online to provide extra capacity during periods of high demand and can also be used to store energy generated by renewables and provide a time shift from when the renewable energy is generated to when the energy is needed (e.g., store energy generated by solar panels during the afternoon and provide the energy to the grid during high-demand evening hours). Additional examples are described below and with reference to FIGS. 1-11.

Figure 1:
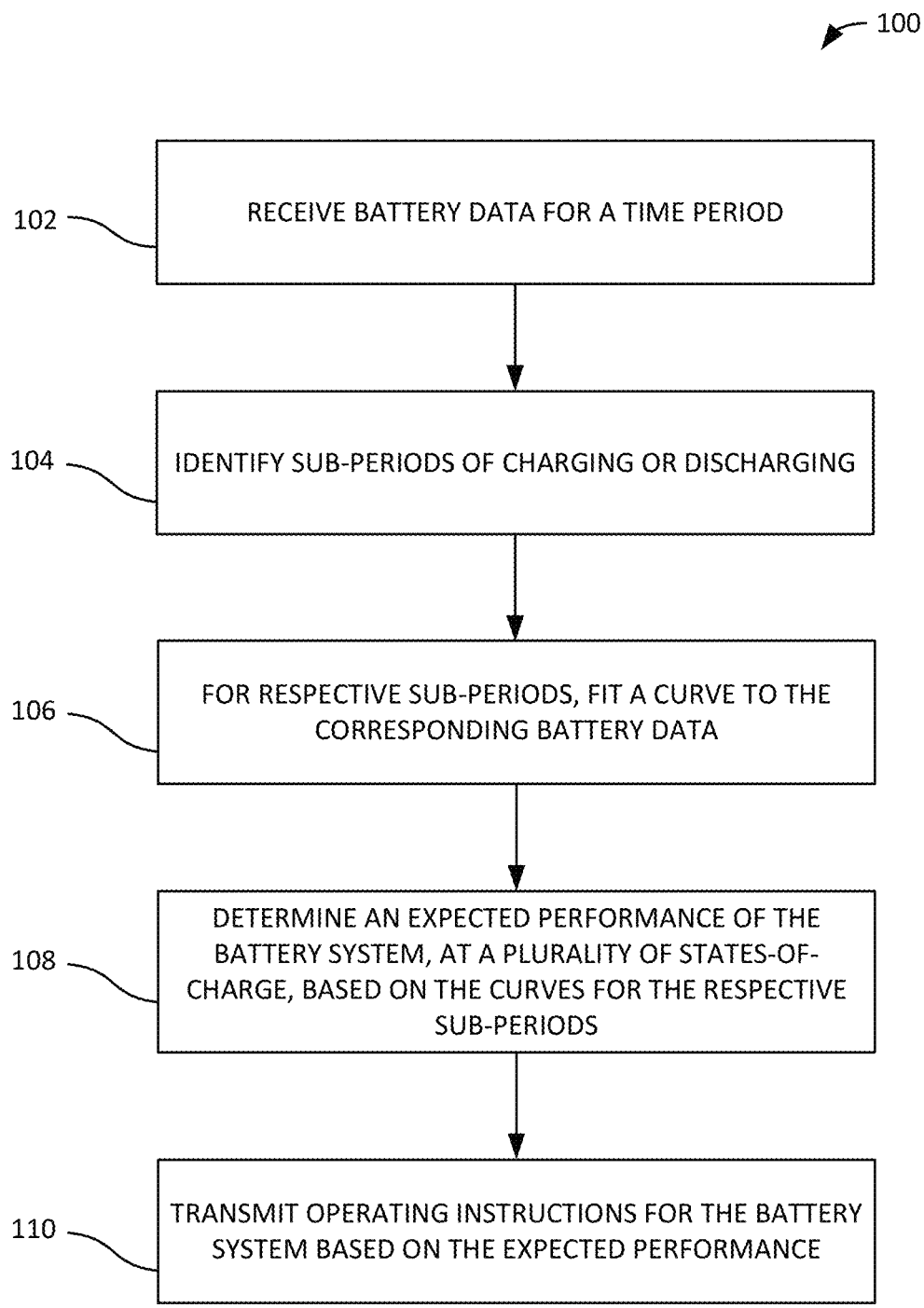
FIG. 1 is a diagram illustrating an example method of determining an expected performance of a battery system and managing operation of the battery system.

FIG. 1 illustrates a method 100 of managing the operation of a battery system. In process block 102, battery data for a time period is received. The battery data represents the actual performance of a battery system over the time period. Battery data can include operating mode (e.g., charging or discharging), state-of-charge (SOC), output power, operating temperature, and/or state-of-health (SOH) as well as other data. Battery data can be time-series data in which one or more types of data is recorded along with a corresponding time. Operating mode can be a flag or other indicator specifying that the battery is charging or discharging (or is disconnected). In some examples, operating mode can be inferred from other measurements (e.g., magnitude or sign of current flow). Output power can be measured, for example, by obtaining voltage and/or current measurements and calculating power. Operating temperature can be measured using temperature sensors interior or exterior to the battery system. SOH can be, for example, a parameter that reflects battery age, cumulative energy throughput, number of charge and/or discharge cycles the battery has gone through, or other data that impacts battery health. In some examples, SOH is updated periodically and is not determined or recorded for every time period for which other battery data is determined and recorded.

SOC is a measure of a battery's (or battery system's) remaining charge capacity and can be represented as a percentage (e.g., 70% SOC indicating 70% of the charge remains). SOC can be determined, for example, by measuring a voltage and comparing the measured voltage against a fully charged voltage as well as by other methods. The way SOC is measured can vary depending on battery chemistry (e.g., lithium ion, lead acid, vanadium flow, nickel-metal hydride (NiMH), nickel cadmium (NiCad), etc.). Battery data can be recorded while the batteries of the battery system are operating and can either be stored locally or uploaded/streamed to a remote computing device (such as a server computer in a cloud computing environment).

In process block 104, sub-periods of charging or discharging are identified in the time period. The battery system can behave differently during charging and discharging, so both types of behavior can be analyzed. In some examples, the sub-periods of charging or discharging are sub-periods over which a rate of charging or discharging varies less than a threshold amount, indicating nearly constant charge or discharge. The threshold amount can be, for example, three percent, five percent, 10 percent, or other percent. The threshold amount can also be measured as another quantity, such as kW/hour. In some examples, the sub-periods of charging or discharging are sub-periods over which SOC changes more than a threshold amount and/or or a time threshold is exceeded. The threshold amount can be, for example, 40 percent, 30 percent, 25 percent, 20 percent, 10 percent, etc. of an initial SOC. The time threshold can be any length of time (e.g., 30 minutes, one hour, two hours, etc.). Identifying charging or discharging sub-periods using any of the above thresholds and approaches acts to limit the identified sub-periods to those in which useful data (in quantity and/or quality) is likely to be obtained for determining expected performance.

In process block 106, a curve is fit to the battery data for the respective time periods. As used herein, "curve" refers to any non-linear function. Various curves, including polynomials of different orders, can be used to fit the data. In some examples, the curves represent a change in SOC with respect to time (dSOC/dt) for different SOC values. The relationship between dSOC/dt and SOC can be modeled, for example, by the following equation:

$$\frac{dSOC}{dt} = a(SOC - b)^c \quad (1)$$

In equation 1, a, b, and c are parameters (e.g., constants) that are determined through the curve fitting process. Because the data for each sub-period is real-world data, each charging or discharging sub-period is associated with an operating temperature and an output power or input power (or range of operating temperatures and range of output/input powers). Example curves are illustrated in, for example, FIGS. 2-5B and 6B. In some examples, the battery data for the respective sub-periods of time is smoothed prior to fitting the curve to the battery data. Smoothing examples are discussed in more detail with respect to FIG. 2.

Based at least in part on the curves for the battery data corresponding to the respective sub-periods of time, an expected performance of the battery system at a plurality of SOCs is determined in process block 108. The expected performance can be determined without accounting for a battery type of the batteries in the battery system. That is, the described approaches are battery-type-agnostic and can be applied to any battery system or other non-battery energy storage system (e.g., pumped hydroelectric storage or flywheels). Determining the expected performance of the battery system can include generating a performance model of how SOC changes over time with respect to at least one of: output power, operating temperature, or SOC. The performance model can include a "taper" parameter reflecting an SOC below which, for particular output powers and operating temperatures, a drop in output power exceeds a threshold. Parameter b in equation 1 is an example of a taper parameter. In non-battery examples, viscosity (which changes as a function of temperature) or other data relevant to the particular energy storage system may be used in a performance model.

As an example of generating a performance model, charge and/or discharge curves can be fit for a number of sub-periods of time (e.g., 10, 20, 50, 100, etc.) using equation 1. The values for the parameters a, b, and c for the respective curves can be tabulated, along with the corresponding output or input power and operating temperature. Multiple linear regression or other approaches, including random forest approaches or neural-network based approaches, can then be used to model the curves as a function of power (input for charging, output for discharging) and operating temperature. This example performance model can include equation 1, as well as equations 2, 3, and 4, below, for determining parameters a, b, and c, respectively, $$a = P(K_a + K_{Pa}P + K_{Ta}T) \quad (2)$$

$$b = P(K_b + K_{Pb}P + K_{Tb}T) \quad (3)$$

$$c = K_c + K_{Pc}P + K_{Tc}T \quad (4)$$

where $K_{a/b/c}$ is a general fitting constant, $K_{Pa/b/c}$ is a power fitting constant, $K_{Ta/b/c}$ is a temperature fitting constant, P is the input or output power, and T is the operating temperature. The performance model includes one set of values for $K_{a/b/c}$, $K_{Pa/b/c}$, and $K_{Ta/b/c}$ for charging, and one set of values for $K_{a/b/c}$, $K_{Pa/b/c}$, and $K_{Ta/b/c}$ for discharging, that are determined through the multiple linear regression applied to the curves. If power and operating temperature are known or specified, values of a, b, and c can be determined, and the performance of the battery system for future charge or discharge periods can be predicted. These values for $K_{a/b/c}$, $K_{Pa/b/c}$, and $K_{Ta/b/c}$ can be updated as new data is received and regression analysis is performed on the updated dataset.

This example performance model considers actual power in and out. As a result, the battery can be treated as a "black box," and any losses to pumps, control systems, etc., do not need to be accounted for separately as they are "baked in" to the model. In other models, auxiliary power (e.g., for pumps, control systems, etc.) is considered separately. Some utilities have a separate line for auxiliary power with different (lower) rates, and in such situations the data at the power conversion system can be measured (i.e., actual power going in and out of the BESS excluding the auxiliary power). Example values for $K_{a/b/c}$, $K_{Pa/b/c}$, and $K_{Ta/b/c}$ for a performance model for a specific battery system for which data was gathered are listed below in Table 1 (discharging) and Table 2 (charging).

TABLE 1

Discharging

| Parameter | K | $K_P$ | $K_T$ |
|---|---|---|---|
| a | 1.169E−4 kW$^{-1}$h$^{-1}$ | 5.868E−8 kW$^{-2}$h$^{-1}$ | −2.608E−8 kW$^{-1}$h$^{-1}$ C$^{-1}$ |
| b | 8.10E−4 kW$^{-1}$ | 1.26E−7 kW$^{-2}$ | −9.85E−6 C$^{-1}$ |
| c | −6.527E−1 kW$^{-1}$ | 6.018E−4 kW$^{-2}$ | −1.048E−3 C$^{-1}$ |

TABLE 2

Charging

| Parameter | K | $K_P$ | $K_T$ |
|---|---|---|---|
| a | 7.351E−5 kW$^{-1}$h$^{-1}$ | 2.061E−8 kW$^{-2}$h−1 | 5.545E−7 kW$^{-1}$h$^{-1}$C$^{-1}$ |
| b | 0 | 0 | 0 |
| c | −1.353E+0 kW$^{-1}$ | 3.895E−4 kW$^{-2}$ | 1.357E−2 C$^{-1}$ |

As can be seen in Table 2, because parameter b relates to taper of output power (and Table 2 relates to charging rather than discharging), the values of $K_b$, $K_{Pb}$, and $K_{Tb}$ are zero so that, using equation 3, parameter b will be zero.

In process block 110, operating instructions for the battery system are transmitted based on the expected performance. The operating instructions can, for example, enable the battery system to be operated in a manner that reduces losses and/or increases the RTE of the system during operation. The operating instructions can specify, for example, at least one of: one or more SOCs below which tapering occurs; one or more preferred operating temperatures or preferred output powers; a time over which the battery system is capable of providing a desired power for a particular initial SOC; or performance model parameters (e.g., $K_{a/b/c}$, $K_{Pa/b/c}$, and/or $K_{Ta/b/c}$ or a, b, and/or c). Operating instructions can also include the minimum required RTE for a particular operating mode (for example, if discharge is the desired operating mode, the specification of a minimum RTE over a specified SOC range would fix the upper limit of the discharge power, assuming charge is done at the rated power for the system (which for the flow battery is 600 kW). Instructions can also include a command to discharge (or charge) at the maximum power available for a minimum state of charge excursion, with discrete discharge steps, with each step being a fixed percent of the previous step, and the termination condition of a fixed state of charge. This allows discharging (or charging) the battery system in sequential steps, with each step corresponding to the maximum power that meets the imposed conditions. The instructions may also take into consideration the battery system temperature and the anticipated temperature excursion at each power level to cap the power being requested of the battery during discharge or the power being delivered to the battery during charge. This automatically takes into account the endothermic charge and exothermic discharge for a Li-ion or vanadium redox flow battery. The operating instructions can be transmitted to a battery system management computing device or battery controller in communication with the batteries of the battery system. A battery system controller (which can include, for example, a programmable logic device) can be configured to control the operation of the batteries in the battery system and to receive the operating instructions.

In some examples, method 100 further comprises after transmitting the operating instructions, receiving additional battery data, updating the expected performance of the battery system based on the additional battery data, and transmitting updated operating instructions for the battery system. In such examples, as more and more battery data is gathered, a more accurate performance model can be determined and more accurate operating instructions for efficient operation can be generated and transmitted.

Figure 2:
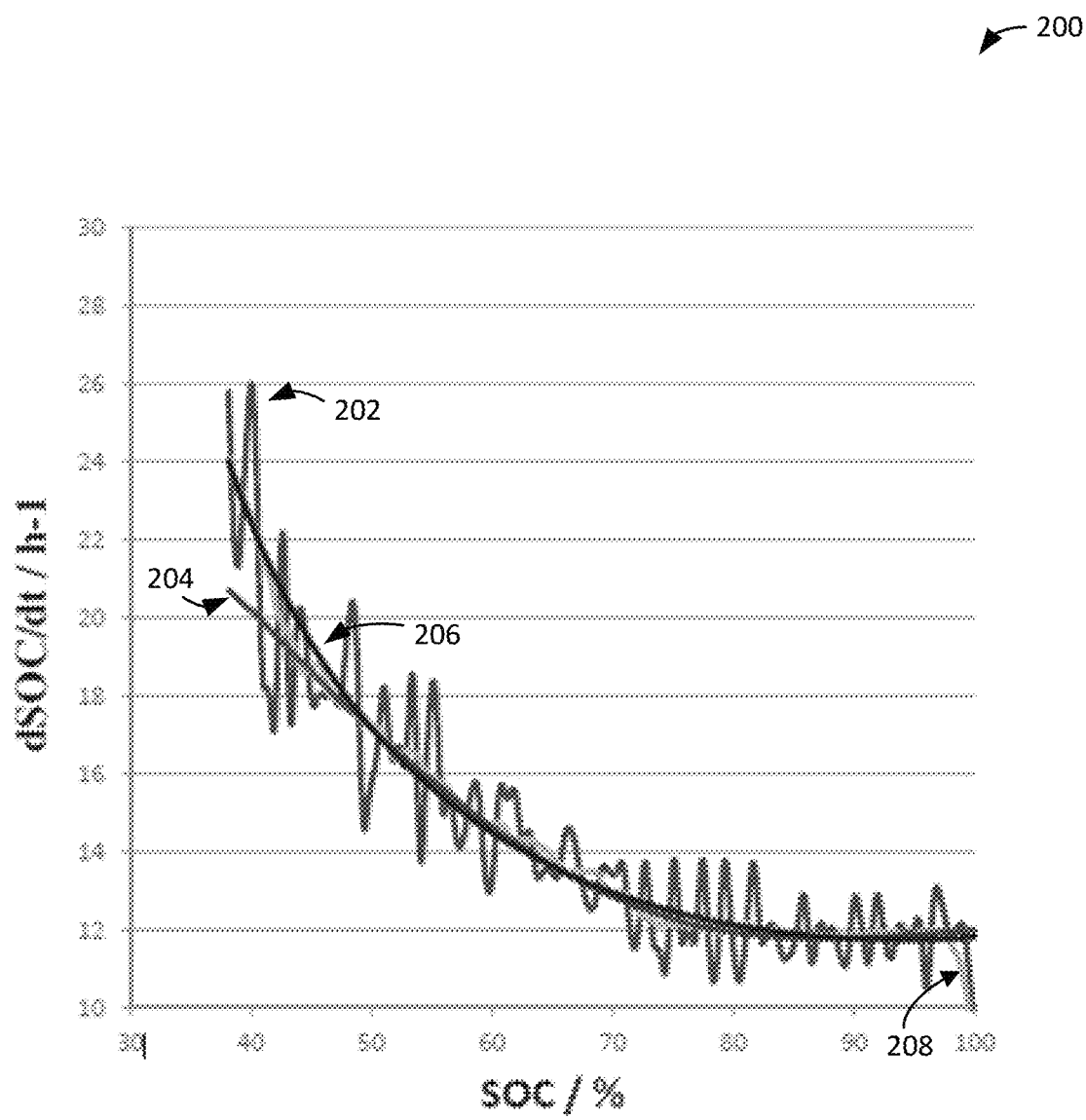
FIG. 2 is a graph illustrating change in state-of-charge (SOC) with respect to time versus SOC for raw data and data smoothed using different approaches.

FIG. 2 shows a graph 200 that represents a sub-period of time, such as one identified in process block 104 of FIG. 1. Graph 200 includes an instantaneous dSOC/dt versus SOC plot 202. As described, for example, with respect to process block 106 of FIG. 1, a curve can be fit to the data shown in graph 200 using equation 1. Instantaneous dSOC/dt versus SOC plot 202 appears somewhat noisy. One reason for the noisy appearance is that in the data that forms the basis for FIG. 2, new data was recorded each time a 0.6% change in SOC is detected rather than being continuously recorded, although other percent change thresholds, as well as continuous recording, are possible. Further, noise can be amplified when the derivative is taken (to determine dSOC/dt).

In some examples, data smoothing is applied to alleviate these issues. Data smoothing can be done using a variety of approaches, including applying a smoothing spline, fitting a polynomial to SOC as a function of time, or fitting a polynomial to time as a function of SOC. Plot 204 shows the derivative of a polynomial fit to SOC as a function of time and plot 206 shows the derivative of a polynomial fit to time as a function of SOC. After smoothing, a curve is fit to the smoothed data as discussed, for example, with respect to process block 106 in FIG. 1. Plot 208 shows a moving average of the instantaneous dSOC/dt represented by plot 202.

In some examples, a non-smoothing approach is used. When smoothing the data (e.g., smoothing SOC as a function of time so that the derivative can be taken), some information is lost. The process of taking the time derivative can amplify any noise left which can also complicate the curve fitting. By fitting a curve to SOC as a function of time rather than smoothing, such loss of information and errors can be limited or avoided. Equation 1 can be integrated to obtain $$\frac{1}{a}(SOC - b)^{-c} dSOC = dt \qquad (5)$$

$$\frac{1}{a}\int_{SOC_i}^{SOC_t}(SOC-b)^{-c}dSOC = \int_0^t dt \qquad (6)$$

$$\frac{1}{a(1-c)}((SOC-b)^{1-c} - (SOC_i-b)^{1-c}) = t \qquad (7)$$

Equation 7 represents time (t) as a function of SOC, and the parameters a, b, and c can be determined without taking a derivative. $SOC_i$ is the initial SOC when t=0. SOC as a function of time is often what is ultimately of interest. For the examples and approaches described herein, equations 5, 6, or 7 can be used in place of equation 1 and in conjunction with equations 2, 3, and 4.

Figure 3:
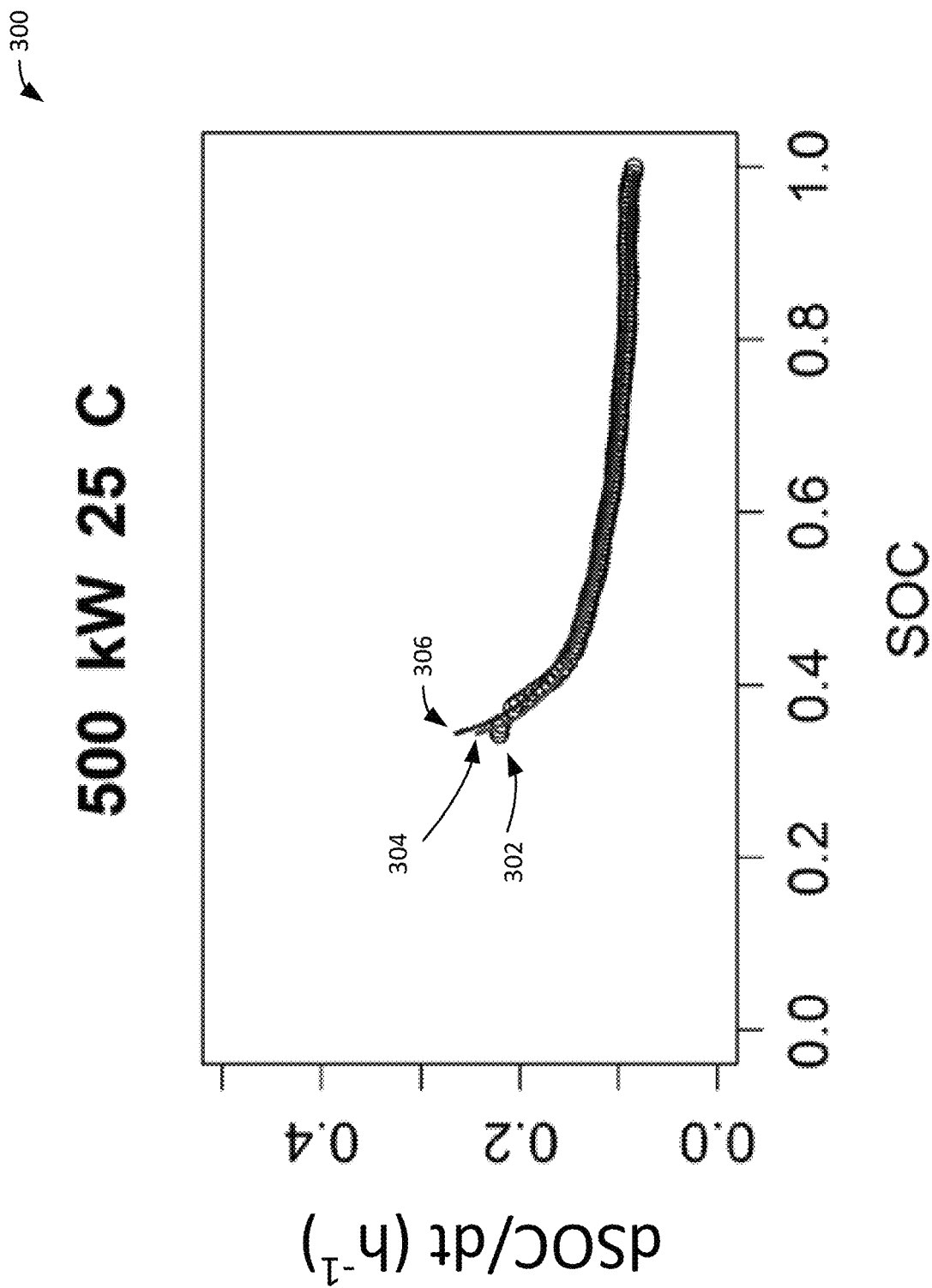
FIG. 3 is a graph illustrating change in SOC with respect to time versus SOC for a 3200 kWh battery energy storage system (BESS) at a 500 kW output power and a 25 degree C. operating temperature.

FIG. 3 illustrates a graph 300 of dSOC/dt versus SOC for an output power of 500 kW and an operating temperature of 25 degrees C. for a sub-period of time. Plot 302 is the actual received battery data (shown as small circles). Plot 304 is a curve fit to the data points in plot 302 (as explained with reference to process block 106 of FIG. 1, for example). Plot 306 represents the performance model for the battery system as a whole (as explained with reference to process block 108 of FIG. 1, for example). Plot 306 can be made, for example, using equations 1-4, with a value for P of 500 kW and a value for T of 25 C used, and values for $K_{a/b/c}$, $K_{Pa/b/c}$, and $K_{Ta/b/c}$ determined using multiple linear regression over the curves fit for multiple individual sub-periods of time.

Figure 4:
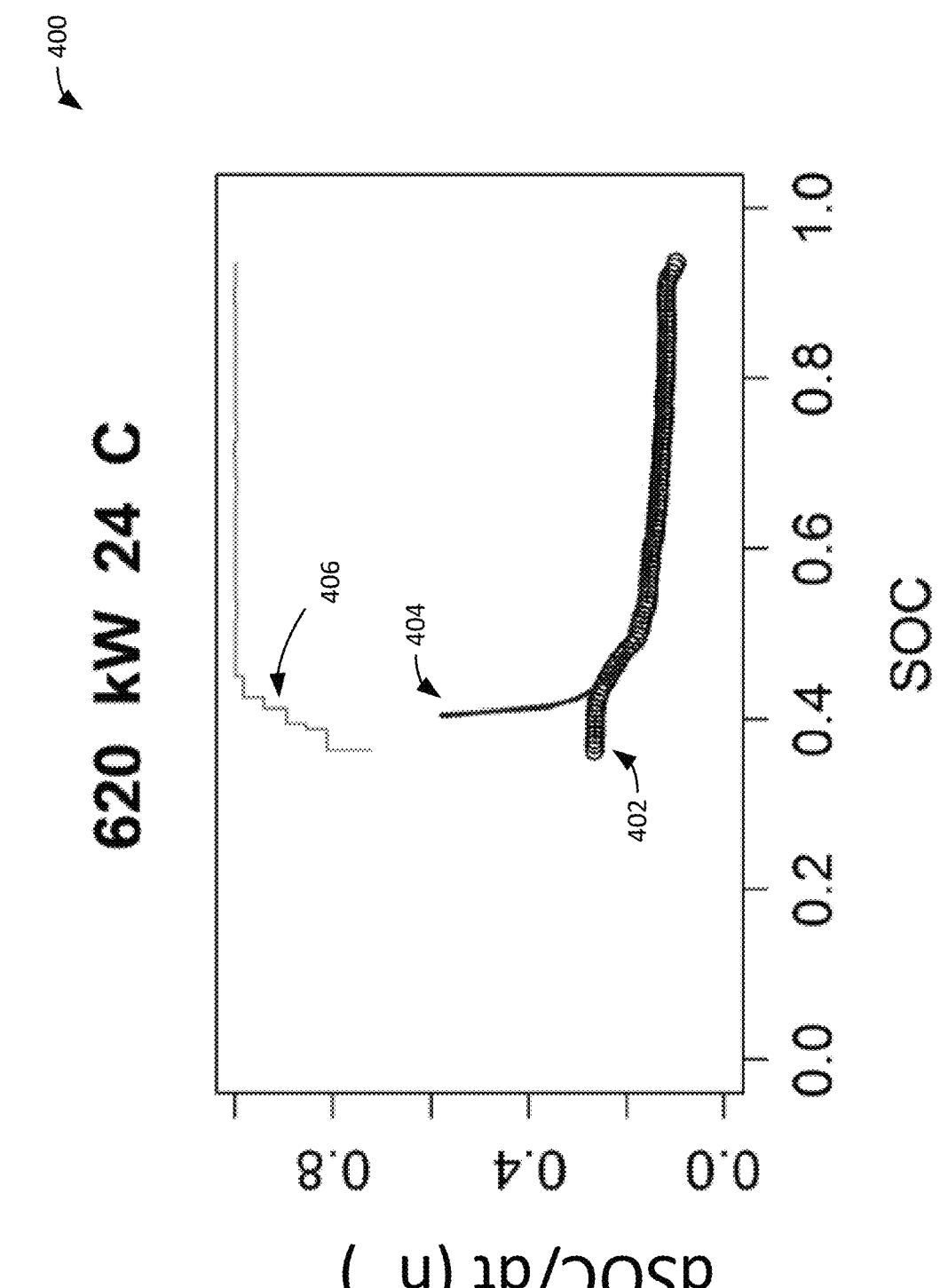
FIG. 4 is a graph illustrating change in SOC with respect to time versus SOC for a 3200 kWh BESS at a 620 kW output power and a 24 degree C. operating temperature plotted with the parameter "b".

FIG. 4 illustrates a graph 400 of dSOC/dt versus SOC for an output power of 620 kW and an operating temperature of 24 degrees C. for a sub-period of time. Plot 402 is the actual received battery data (shown as small circles). Plot 404 represents the performance model for the battery system as a whole (as explained with reference to process block 108 of FIG. 1, for example). Plot 404 illustrates tapering in the battery system. During discharge, after the battery system is drawn down to a certain SOC, the change in SOC increases rapidly (as shown by the upward trajectory of curve 404 going left) with continued power draw, indicating the battery system is unable to provide the desired output power. Plot 406 illustrates output power, which had been relatively constant on the right side of graph 400 dropping off as plot 404 curves upward. The taper point corresponds to the parameter b, and this value (when SOC=b, approximately 0.4 in FIG. 4) acts as a vertical asymptote for plot 404.

Figure 5A:
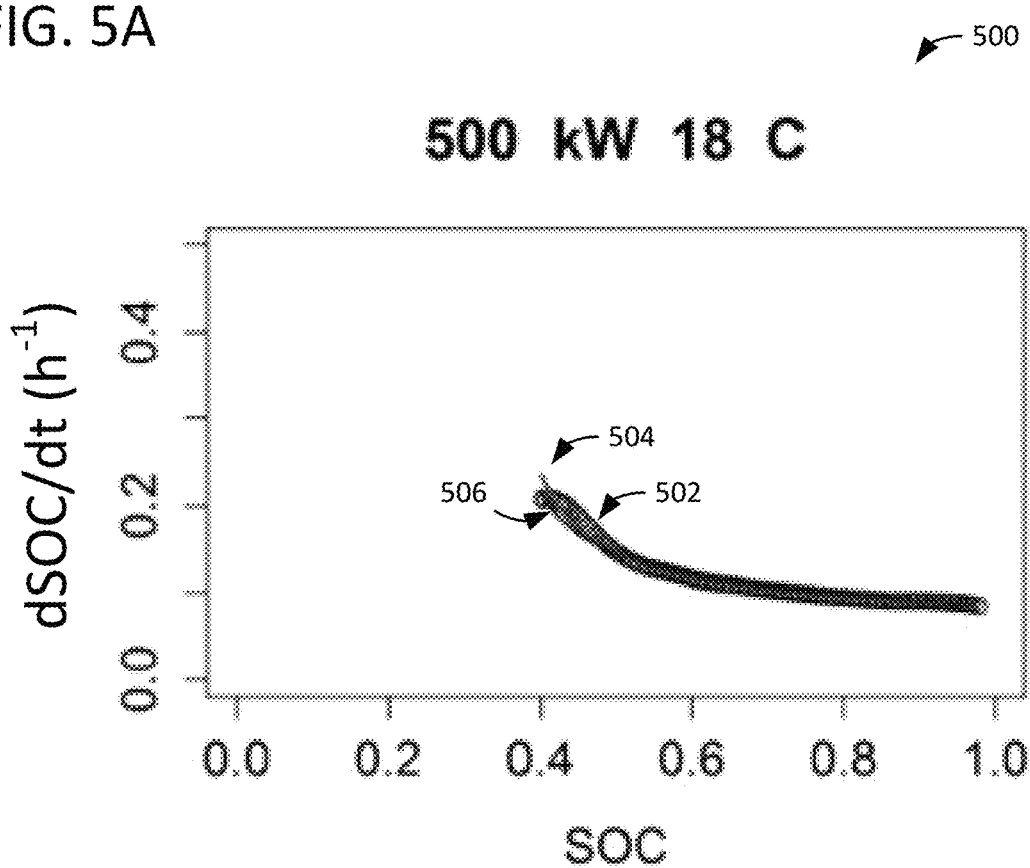
FIGS. 5A-5B illustrate change in SOC with respect to time versus SOC for a 3200 kWh BESS at a 500 kW output power at two different operating temperatures.
Figure 5B:
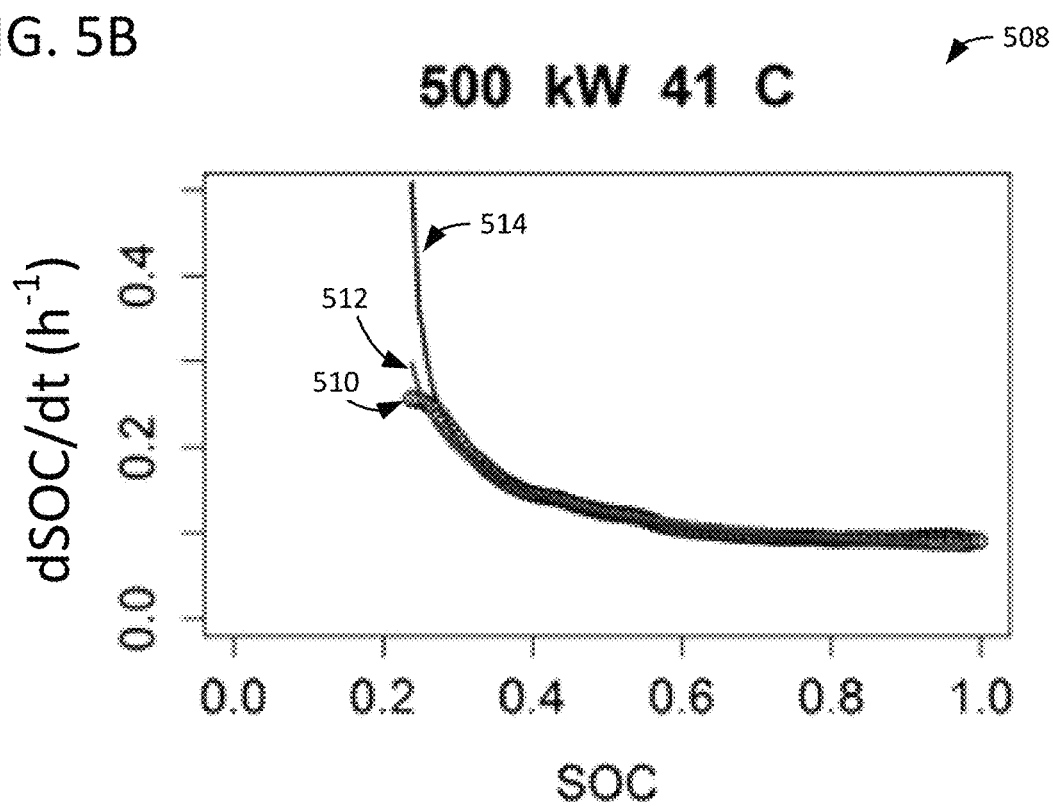

FIGS. 5A and 5B illustrate the difference in performance for a battery system of different operating temperatures. Graph 500 of FIG. 5A shows a plot 502 representing received battery data, a plot 504 representing a curve fit to the data points in plot 502, and plot 506 representing a performance model for the battery system as a whole. Graph 508 of FIG. 5B shows a plot 510 representing received battery data, a plot 512 representing a curve fit to the data points in plot 510, and plot 514 representing a performance model for the battery system as a whole. The curves in FIG. 5B begin to increase rapidly at a lower value of SOC (approximately 0.3) in comparison to the curves of FIG. 5A, which increase rapidly at approximately 0.4 SOC. This difference indicates that the battery system can provide a 500 kW output power for longer when the operating temperature is higher.

Figure 6A:
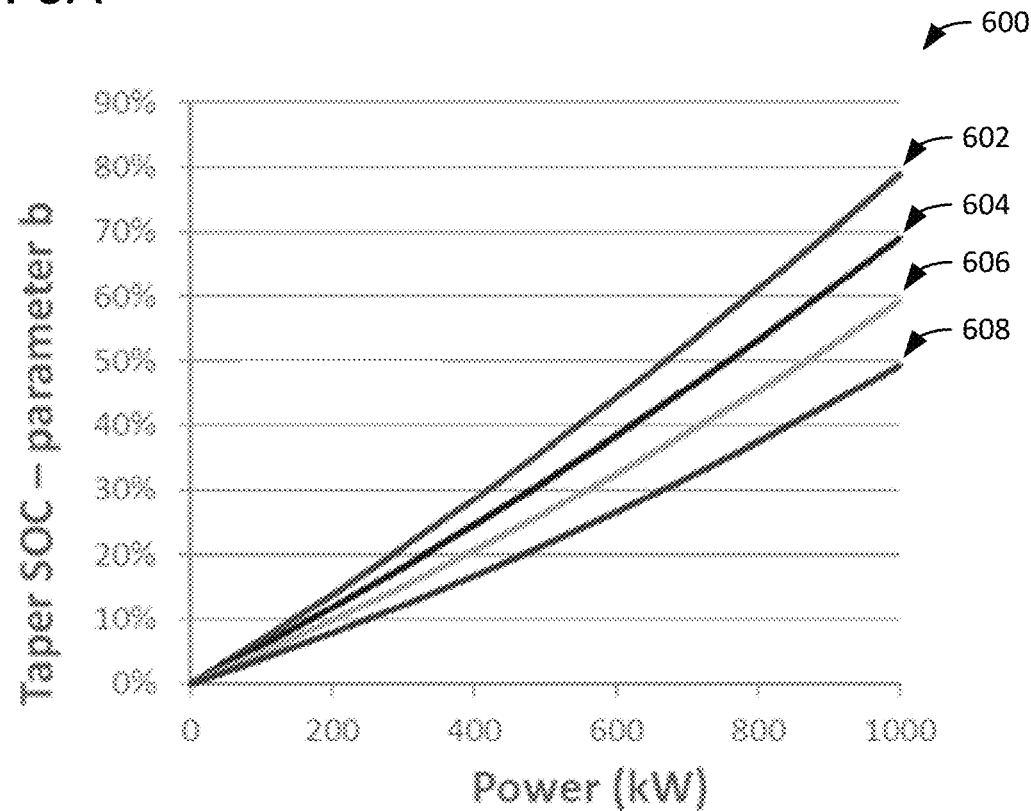
FIG. 6A illustrates parameter b in a 3200 kWh BESS at different output powers and operating temperatures.
Figure 6B:
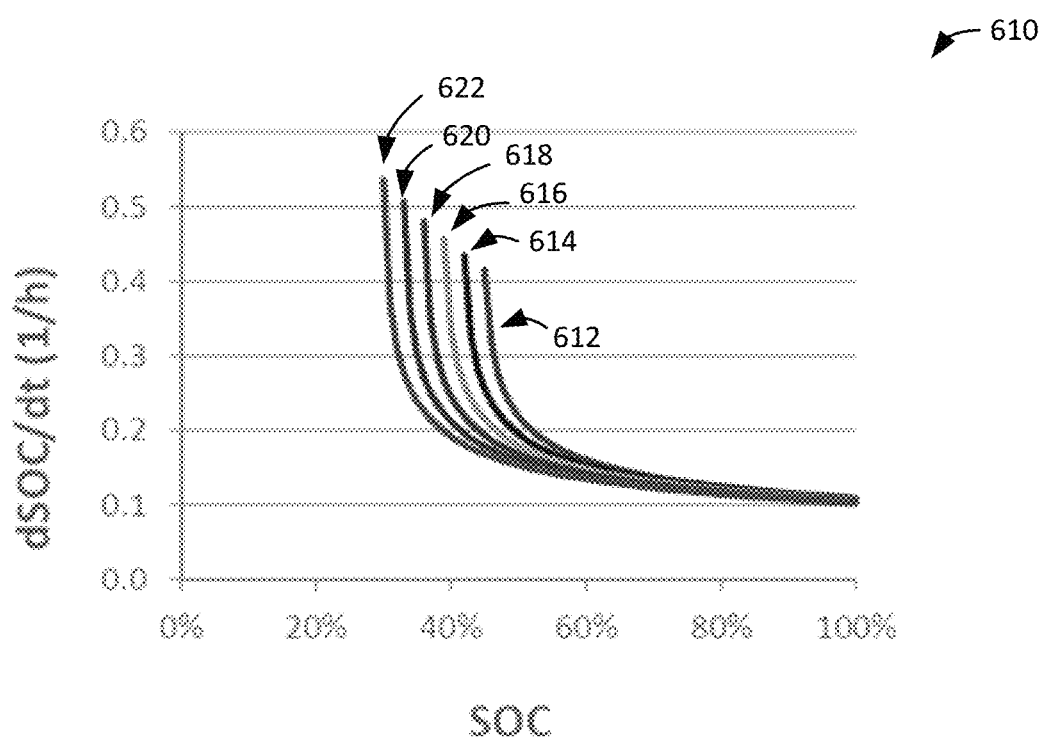
FIG. 6B illustrates change in SOC with respect to time versus SOC at various temperatures and indicates the SOC for each temperature at which output power drops off.

FIGS. 6A and 6B also illustrate the effect of temperature. FIG. 6A shows a graph 600 in which parameter b, representing the tapering of SOC, is plotted against output power. Although shown as percentages, parameter b can be represented as a decimal. Plot 602 represents an operating temperature of 15 C, plot 604 represents an operating temperature of 25 C, plot 606 represents an operating temperature of 35 C, and plot 608 represents an operating temperature of 45 C. Each of the plots 602, 604, 606, and 608 show that the higher the output power, the higher the SOC at which taper occurs. Plots 602, 604, 606, and 608 also indicate that for a given output power, the higher the operating temperature, the lower the SOC at which taper occurs (and the longer the battery system can provide the given power). FIG. 6B further illustrates the effect of temperature in graph 610. Plots 612, 614, 616, 618, 620, and 622 represent dSOC/dt versus SOC at 15 C, 20 C, 25 C, 30 C, 35 C, and 40C, respectively. The point at which plots 612, 614, 616, 618, 620, and 622 rapidly rise upwards corresponds to the parameter b and indicates the SOC at which the output power can no longer be maintained. Plot 622, which corresponds to 40 C has the highest operating temperature in FIG. 6B and therefore shows that output power can be maintained the longest (i.e., the SOC at which taper occurs is lowest of the temperatures shown in FIG. 6B).

Figure 7:
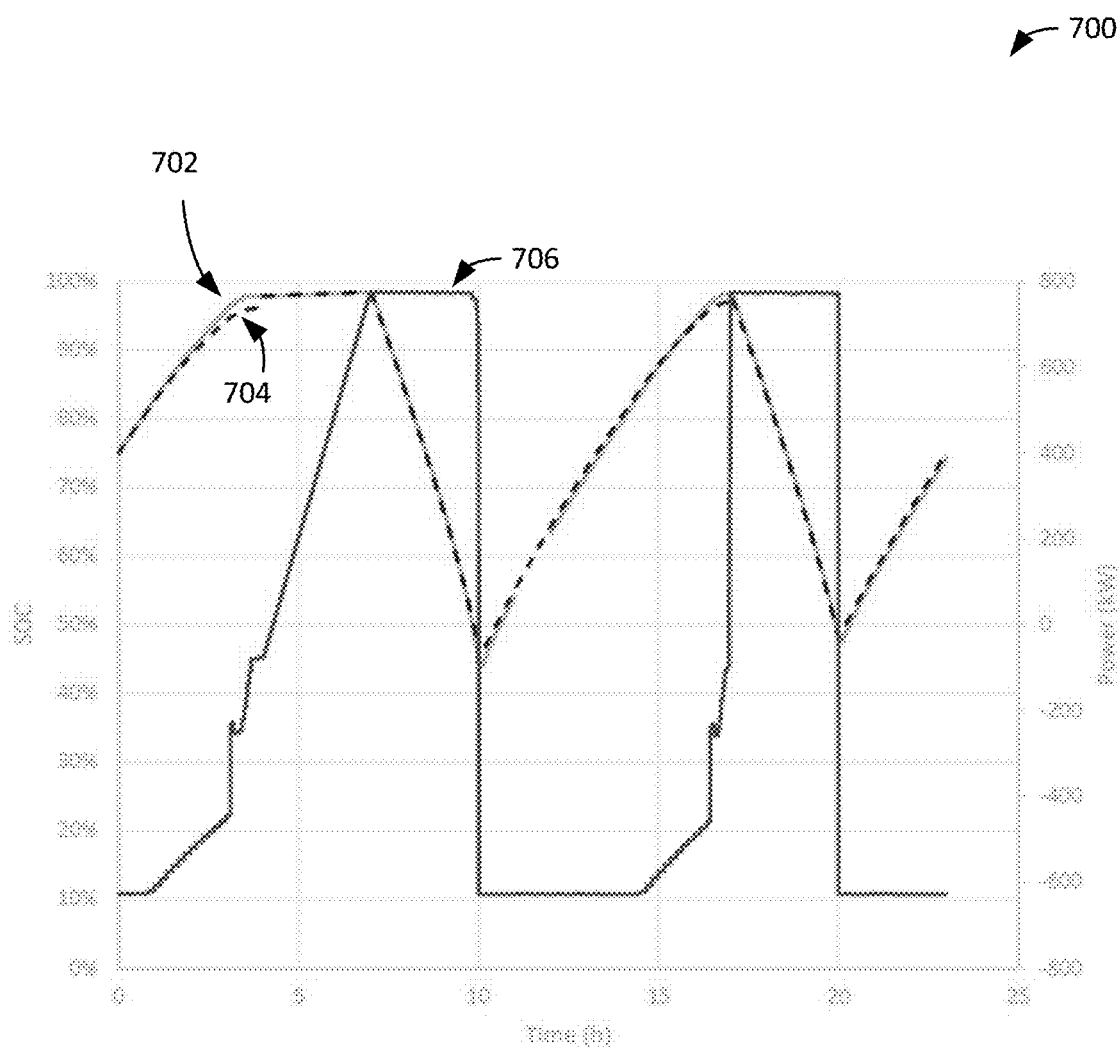
FIG. 7 is a graph illustrating performance estimates versus actual performance in a peak shaving example.

FIG. 7 illustrates a graph 700 of a peak shaving use case. Plot 702 is the actual SOC of the battery system, and plot 704 is the SOC predicted by the performance model. Plot 706 is a plot of output power. Graph 700 illustrates operation of the battery system over charging and discharging cycles. For example, as plots 702 and 704 begin at the left side and increase SOC up to near 100%, the battery system is charging. At the first (starting from the left) intersection of plot 706 and plots 702 and 704, discharging has begun. At this point, SOC, represented by plots 702 and 704, decreases as a stable output power is provided until approximately t=10 hr (taper point) where SOC has been reduced to a level at which output power cannot be maintained.

Another charging cycle follows immediately after t=10 hr. In FIG. 7, plots 702 (actual SOC) and 704 (predicted SOC) track very closely but diverge somewhat in the charging cycle before t=5 hr. This is a result of limited data gathered for charging. With additional data and performance model updating, plots 702 and 704 will track even more closely.

Figure 8:
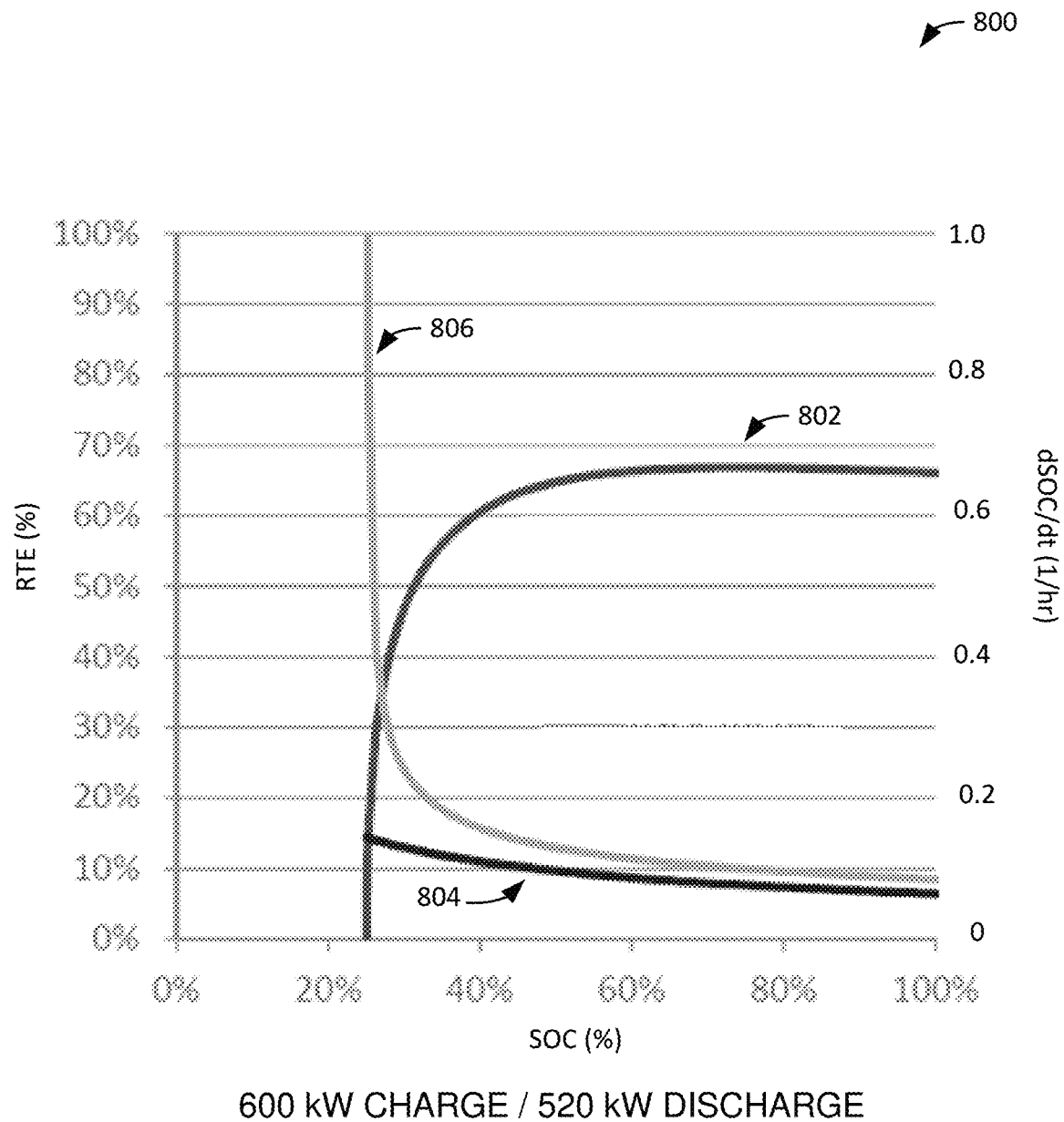
FIG. 8 is a graph illustrating round-trip efficiency for a 600 kW output power charging and 520 kW discharging example.

FIG. 8 illustrates RTE, which represents the energy recovered from a battery system as compared to the energy input to charge the battery system. Energy recovered is always less than energy input due to thermal losses, battery management controls, and other reasons. RTE can be a useful metric for comparing different batteries and the same batteries in different conditions. Using the approaches described herein, RTE can be more directly calculated from data rather than approximated as was previously done. Instantaneous RTE can be calculated from dSOC/dt curves as follows:

$$dSOC = \frac{1}{\eta_{dis}}\frac{Pdt}{E_{tot}} \qquad (8)$$

$$dSOC = \eta_{chg}\frac{Pdt}{E_{tot}} \qquad (9)$$

$$RTE = \eta_{chg}\eta_{dis} = \frac{P_{dis}}{P_{chg}}\frac{\left(\frac{dSOC}{dt}\right)_{chg}}{P_{chg}\left(\frac{dSOC}{dt}\right)_{dis}} \qquad (10)$$

where $\eta_{chg}$ is the one-way charging efficiency, $\eta_{dis}$ is the one-way discharging efficiency, P is power, $E_{tot}$ is total energy provided to the battery system, $P_{dis}$ is output power during discharge, and $P_{chg}$ is input power provided to charge the battery system. Graph 800 in FIG. 8 illustrates RTE (shown as a percent) in plot 802 for a 600 kW charge and a 520 kW discharge. Plot 804 represents dSOC/dt for charging, and plot 806 represents dSOC/dt for discharging.

Figure 9:
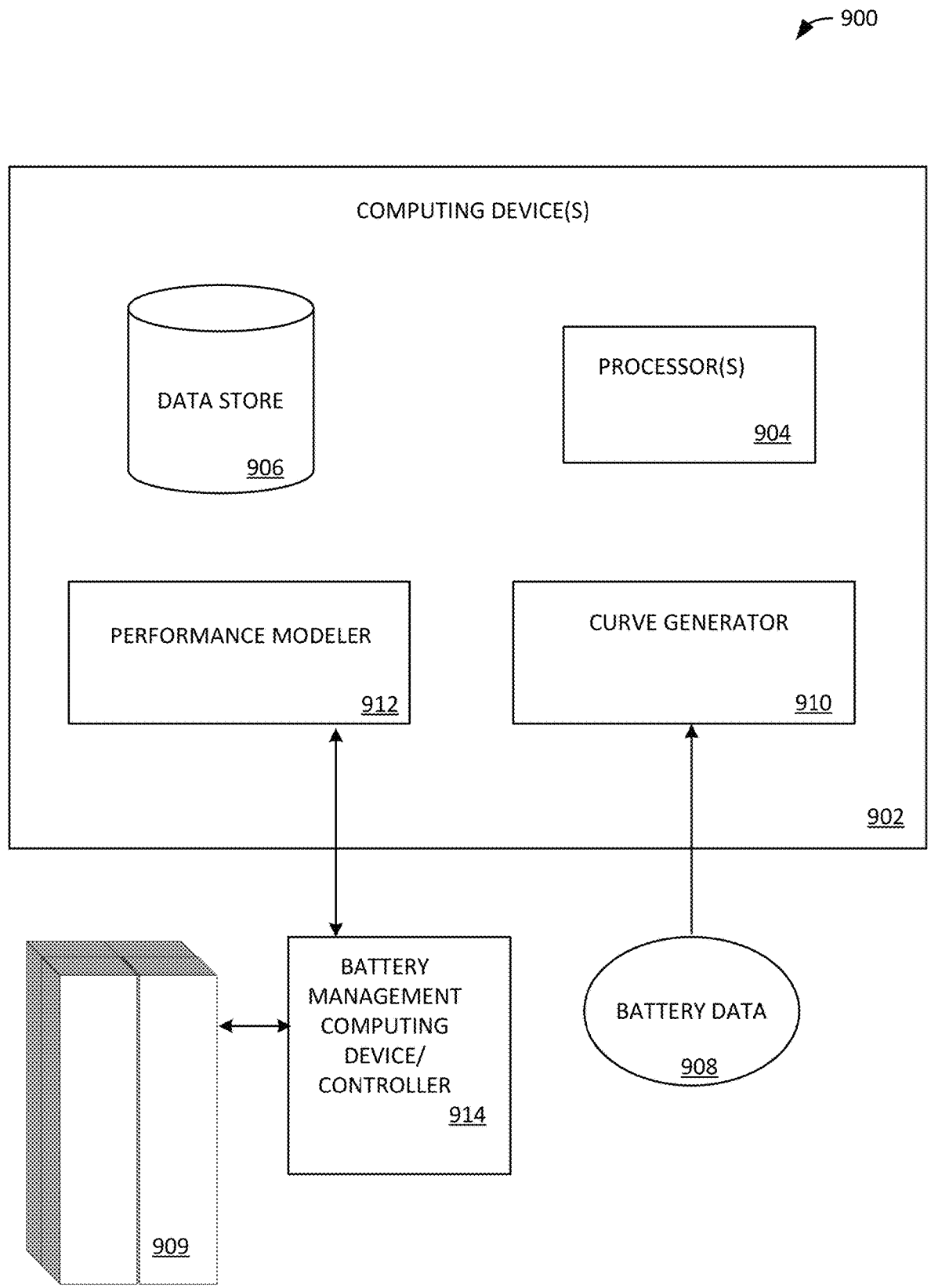
FIG. 9 is a block diagram of an example battery system management system.

FIG. 9 illustrates a system 900 implemented on one or more computing devices 902. System 900 can implement, for example, method 100 of FIG. 1 as well as other approaches described herein. Computing device(s) 902 include at least one processor 904 and a data store 906. Data store 906 can store battery data 908 for a battery system 909 as well as parameters and a performance model representing the battery system. Battery data 908 is received via computing device(s) 902. Battery data 908 can include operating mode (e.g., charging or discharging), SOC, output power, and/or operating temperature, as well as other data. Battery data 908 can be time-series data in which one or more types of data is recorded along with a corresponding time. Battery data 908 represents performance of a battery system over a time period.

A curve generator 910 is configured to, by the at least one processor 904, identify sub-periods of charging or discharging in battery data 908. The sub-periods of charging or discharging are sub-periods over which a rate of charging or discharging varies less than a threshold amount, indicating nearly constant charge or discharge. In some examples, the sub-periods of charging or discharging are sub-periods over which SOC changes more than a threshold amount and/or or a time threshold is exceeded.

Curve generator 910 is also configured to, by the at least one processor 904 and for the respective sub-periods of time, determine a function that represents the battery data corresponding to the time period. Various functions, including polynomials of different orders, can be used to fit the data. The functions can be stored in data store 906. In some examples, the functions represent a change in SOC with respect to time (dSOC/dt) for different SOC values. Example functions are found in equations 1 and 5-7.

A performance modeler 912 is configured to, by the at least one processor 904, generate a performance model, based at least in part on the functions for battery data 908 corresponding to the respective sub-periods of time, for how SOC of the battery system changes with respect to a plurality of operating conditions. The performance model can indicate how SOC changes over time with respect to at least one of: output or input power, operating temperature, or SOC. The performance model can include a "taper" parameter reflecting an SOC below which, for particular output powers and operating temperatures, a drop in output power exceeds a threshold. Parameter b in equation 1 is an example of a taper parameter. A performance model can be generated using equations 1 or 5-7 in conjunction with equations 2-4 using multiple linear regression or other approaches as discussed with respect to FIG. 1.

Performance modeler 912 can also be configured to generate operating instructions for the battery system based on the performance model. The operating instructions can specify an SOC below which tapering occurs, preferred temperatures or input/output powers, a time over which the battery system is capable of providing a desired power for a particular initial SOC, or parameter values, for example. The operating instructions can be transmitted to a battery system management computing device or battery controller 914 in communication with the batteries of battery system 909. Battery system management computing device or battery controller 914 can also be referred to as (or be part of) a battery system management system. In some examples, computing device(s) 902 is also considered part of the battery system management system. Battery system management computing device or battery controller 914 (which can include, for example, a programmable logic device and/or processor) can be configured to control the operation of the batteries in battery system 909 and to receive the operating instructions. In some examples, battery system management computing device or battery controller 914 is configured to provide battery data 908 to computing device(s) 902. Battery system 909 can be deployed in a power grid or other power supply infrastructure. In some examples, system 900 includes battery system 909 and/or battery system management computing device or battery controller 914.

Figure 10:
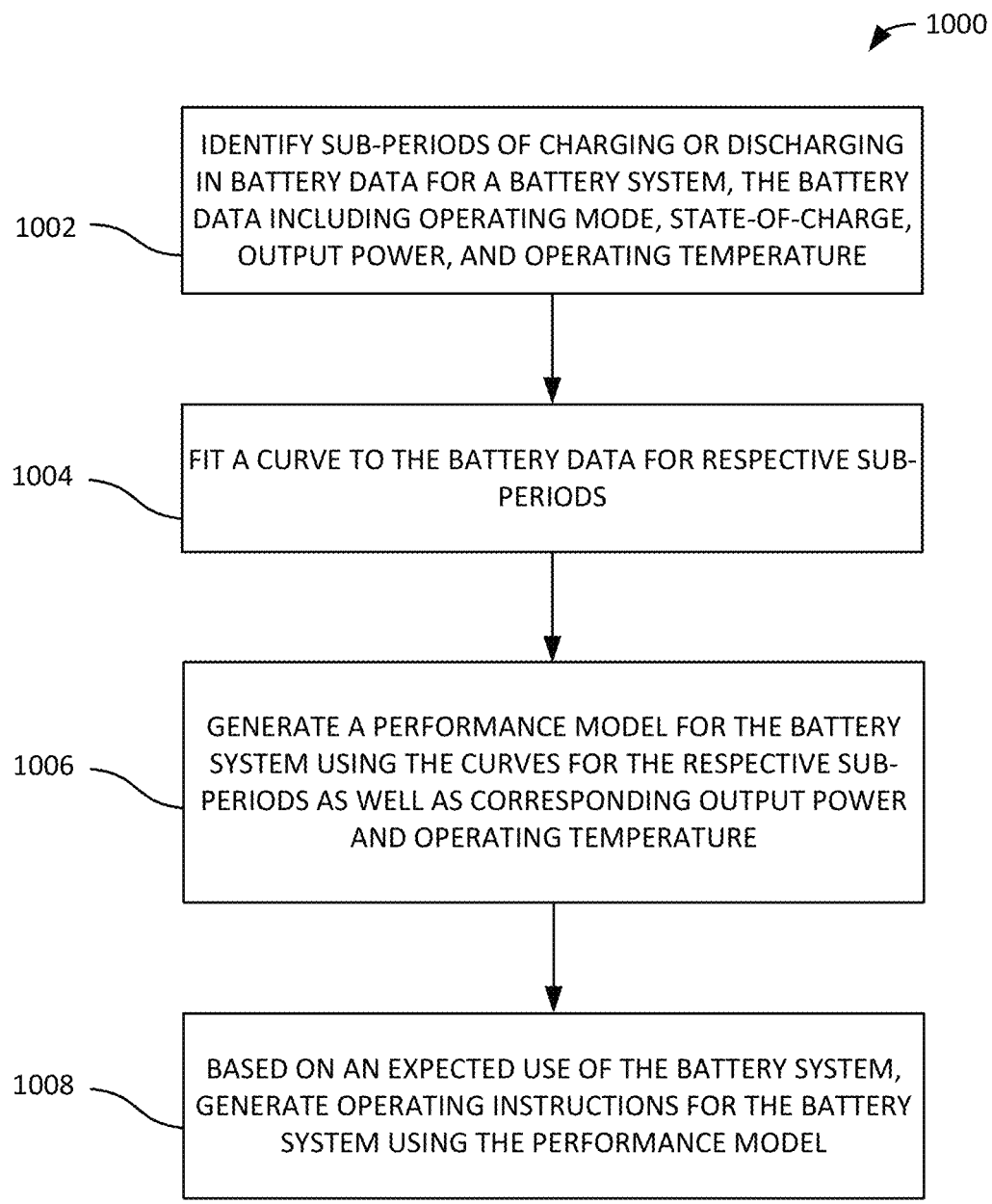
FIG. 10 is a diagram illustrating an example method of managing battery system operation based on a performance model for the battery system.

FIG. 10 illustrates a method 1000 of managing operation of a battery system. Method 1000 can be performed using, for example, system 900 of FIG. 9. In process block 1002, sub-periods of charging or discharging are identified in battery data representing actual performance of a battery system over a time period. The battery data comprises, for a plurality of times within the time period: operating mode, SOC, output power or input power, and operating temperature. In process block 1004, for the respective sub-periods of time, a curve is fit to the battery data corresponding to the time period. The respective curves represent a change in SOC of the battery system with respect to time versus SOC of the battery system, time as a function of SOC, or SOC as a function of time. The curves can be any of those described with respect to FIG. 1, for example.

In process block 1006, a performance model is generated for the battery system using the curves for the respective sub-periods of time as well as output power and operating temperature corresponding to the curves. The performance model represents an expected performance of the battery system at different SOCs, operating temperatures, and output or input powers. The performance model can be, for example, a performance model as described with respect to FIG. 1. Based on an expected use of the battery system, operating instructions for the battery system are generated using the performance model in process block 1008. The expected use can be, for example, a total desired output power over a period of time or an amount of peak shaving supply. The operating instructions can specify a range of SOC over which a desired output power can be maintained for the expected use of the battery system or an estimated time the battery system can be operated at a desired output power. Method 1000 can also include transmitting the operating instructions to a battery system management computing device associated with the battery system.

The approaches described herein are applicable to both DC and AC batteries/battery systems. The approaches can be applied with temperature measurement within the battery storage system and ambient temperature. This allows quantification of the effect of ambient temperature on the battery storage system performance.

Additional Examples

Previous approaches to managing battery systems typically determined one-way efficiency for charge and discharge. Based on this, a change in SOC was estimated by accounting for losses appropriately. This approach can be viable when the nominal energy content of the battery system is known. In such cases, the delta SOC during discharge duration is simply the energy discharged divided by the battery nominal energy, where nominal energy is the Ampere-hour (Ah) capacity multiplied by the open circuit voltage (OCV) of the battery at 50% SOC.

In order for such conventional approach to work, the Ah capacity of the battery must typically be known. Even if this is known, the nominal energy is simply an approximation, since the OCV need not be a linear function of SOC in the 0 to 100% SOC range. To overcome this, calculations are performed on an Ah basis—that is, Delta SOC=Ah discharged/Ah of battery. This would require going into the "box", which is not always possible. The Ah capacity is sometimes not known. It should be noted that if rated energy is used, the delta SOC is simply energy discharged divided by rated energy during discharge. During charge, the delta SOC is energy charge times RTE/rated energy. This approach can be even more problematic, since the rated energy depends on the discharge power. In other words, for different discharge powers, the "rated energy" or delivered energy is different. Finally, the many steps it takes to calculate one-way efficiency results in compounding error, giving a result that is not reliable at estimating the change in SOC.

One-way DC efficiency can be estimated from the change in DC voltage from its open-circuit voltage. This can also be problematic, as the open circuit voltage as a function of SOC has built-in errors. The one-way efficiency has to be multiplied by the power-conditioning system (PCS) one-way efficiency, and the auxiliary power then has to be accounted for.

The described examples include novel performance models that allow estimation of battery SOC during operation under various conditions such operating mode, power, SOC and temperature. Some of the described approaches circumvent the limitations of conventional approaches by simply fitting dSOC/dt vs SOC data. To do this, SOC versus time is smoothed using a smoothing Spline or other approach. The derivative of the smoothed curves can be calculated by the change in SOC divided by change in time for consecutive data points. This dSOC/dt can be fit versus SOC, for example, using equations 1 or 5-7. This can be done for various power levels and temperatures for both charge and discharge. The fitting parameters for this power law can be tabulated for each power and temperature, and multilinear regression can be used to come up with a general formula that is part of a performance model.

The described approaches remove the need to know a priori the nominal Ah capacity and energy of the battery energy storage system (BESS). An added benefit is that from the dSOC/dt during charge and discharge, the RTE can be estimated. In addition, the RTE at the limit of charge power going to 0 is simply the one-way discharge efficiency. Similarly, the RTE at discharge power tending to 0 is simply the one way charge efficiency. From SOC data, the OCV can be calculated from the known linear relationship provided by the battery operator/manufacturer for OCV as f(SOC) and SOC as f(OCV). Hence, the OCV at the reported SOC can be easily estimated. While OCV as f(SOC) has a built-in error, this error does not figure into any calculations for RTE. The RTE values can be reported at various SOCs. Due to the error in OCV as f(SOC), the reported SOCs are as good as the battery management system supplied by the vendor. In other words, they do not add to any errors in the calculations.

Using this, the one-way DC efficiency can be calculated for discharge or charge by standard methods. The inverter one-way efficiency can also be easily determined. This allows estimation of one-way efficiency from the performance model (after validating it vs. data). Currently, the model uses data that also includes auxiliary power. The BESS provides auxiliary power during discharge and the grid provides auxiliary power during charge. To better fit the data, the performance model can be used with the power measured at the power conversion system rather than at the grid connection point. This can be especially useful for validating one-way efficiency, since the power at the grid is different from 0. In some examples, auxiliary power is accounted for, and the corrected power is used as the one where power tends to 0. For example, if auxiliary power is 15 kW, and 15 kW is chosen as the lower limit of charge or discharge power that enters or leaves the PCS, then, during charge, that corresponds to 30 kW charge at the grid. And for discharge, that corresponds to 0 kW at the grid (assuming auxiliary power is always 15 kW). It should be noted that the entire modeling process can be automated using an R script to process and analyze downloaded battery data.

There is a specific need to estimate the rate of change of SOC of a BESS during operation. This rate is typically not constant during a discharge and depends on the SOC at a fixed power and temperature. Previous models used calculation of one-way efficiency from battery voltage, inverter efficiency, etc. Each of these steps introduces error which can be compounded, and requires several approximations and assumptions that can also introduce error. The described approaches use empirical data from the battery to circumvent the issues inherent to the conventional approach and give a reliable method of estimating change in SOC. The steps needed to calculate one-way efficiency are "baked in" to the dSOC/dt function determined from empirical data.

Previous methods involve using battery DC voltage to determine electrochemical efficiency, and using power to/from the grid and to/from the battery to determine inverter efficiency, to get a one-way efficiency to use to calculate change in SOC. (Note that when auxiliaries are powered by separate lines, the power to and from the grid is the same as power flow to and from the power control system.) This typically does not result in a reliable way of estimating change in SOC. The described approaches, in addition to estimating the rate of charge of SOC as a f(SOC), can also be used to determine RTE and one-way efficiency.

The described approaches can be used for any BESS (or transportation battery systems) as long as SOC as a function of time is known. Due to its use of empirical data, the described performance models do not depend on knowing the system chemistry, rated energy, etc. The performance models can reliably estimate how SOC will change with time based on the operating parameters and past behavior of the system. The described approaches can be used to deploy the BESS for various grid services. The battery operator, with the help of these approaches, can reliably determine the suitability of the BESS for various services by knowing its SOC and the known duty cycle for various applications. For example, if it is known that there will be a demand for peak shaving for 3 hours every day between 5 to 8 PM, the BESS can be deployed for other services to generate revenue (such as Frequency Regulation), with the BESS brought to the desired starting SOC to provide the required power for the required duration.

The described approaches can work in conjunction with a grid simulator that can predict the peak power draw. Once the grid simulator estimates the peak power and the net peak load, the battery operator simply bids an upper limit of power for the required duration, and ensures the BESS is charged to a state that allows it to provide this power. Since BESS performance is dependent on temperature, these approaches can assist the operator in derating the BESS power to bid the right level of power. For frequency regulation, the main advantages of a BESS are instant response and bidding regulation up and regulation down using discharge for regulation up and charge for regulation down. This effectively increases the power of the battery to Pmax discharge–Pmax charge (here discharge is positive and charge negative). Using the vendor specified max charge and discharge powers, the described performance models provide guidance on the maximum allowable charge and discharge rates, at various SOCs. In one specific example, at 95% SOC, the maximum power is only ~500 kW at 30 C, and at 20% SOC, the maximum discharge power is only 400 kW at 30 C. This constrains the SOC range for the BESS to offer frequency regulation.

In short, the described approaches allow the battery operator to plan ahead and get the BESS to the required states to offer various grid services. This, combined with an economic optimization tools, allows maximizing revenue from the BESS.

Operating Instructions/Battery System Control Examples

Battery energy storage systems (BESS) (also referred to herein as battery systems) have become increasingly popular for grid applications due to advances in battery and power electronics technologies as well as the growing need of flexibility and reserve from power systems with rapidly developed renewable generation. Successful assessment and deployment of BESS depends on optimizing its operation and therefore maximizing the potential benefits. As used herein, optimization refers to improvement and does not necessarily imply a "best" mode of operation. Existing approaches of modeling charging/discharging operation and the corresponding impacts on SOC are typically over simplified. The approaches described herein involve an optimal control for BESS evaluation and operational scheduling using a general nonlinear model (also referred to as a performance model) that expresses the change of SOC as a function of charging/discharging power and SOC level. The described approaches are compared with a typical existing method through a real-world energy storage evaluation project to show the significance of the described approaches.

The electric power sector requires flexibility to realize the instantaneous balance between generation and constantly changing demand. Energy storage is a candidate for meeting such a flexibility requirement. With the rapid growth in renewable energy, their inherent uncertainty and variability present difficulties and challenges to system operators. Recent developments and advances in energy storage and power electronics technologies are making their application a viable solution for grid problems. As many countries are placing greater emphasis on renewable generation, energy storage is becoming increasingly important and holds substantial promise for transforming the electric power industry. Previous attempts at optimizing and evaluating battery systems for grid applications, however, are typically not capable of accurately modeling BESS operation. For example, conventional approaches typically use RTE to capture BESS losses. However, the same RTE with different one-way charging/discharging efficiencies may yield a different optimal operating schedule. More importantly, due to the incapability of representing one-way efficiencies in optimization, SOC cannot be accurately estimated during charging (or discharging) and therefore an infeasible operating schedule could be obtained.

Further, conventional approaches are typically capable of handling constant but not varying efficiencies. Such approaches cannot typically model varying capability of charging/discharging power at different SOC levels. The novel approaches described herein develop an optimal control for a BESS using a general nonlinear model that expresses the change of SOC as a function of charging/discharging power and SOC level.

A conventional approach using a BESS model with constant efficiency to determine battery control in economic assessment and operational scheduling is discussed below. Because the amount of energy stored in a BESS is limited, the charging/discharging operation at different time periods is interdependent. For example, injecting more energy into grid in one hour increases the benefits at that hour, but results in less energy for future use, and therefore may reduce the overall economic benefits. Therefore, effective scheduling should be performed over multiple time periods. A BESS also has charging/discharging power capacity, for which different grid services may compete against each other. For example, increasing discharging power for energy arbitrage service decreases the battery's capability for other services. Moreover, there are losses associated with BESS charging/discharging operation, which should be modeled and considered in a scheduling formulation in order to obtain profitable and effective operating plan.

In the case of energy arbitrage, the objective function is the net benefits of battery charging/discharging for given hourly energy prices over a look-ahead time horizon, as expressed below:

$$\sum_{k=1}^{K} \lambda_k p_k \Delta T \quad (11)$$

where $p_k$ is the power exchanged between the BESS and the grid (measured at the grid connection point) during time period k, which is positive when injecting power into grid, K is the number of time periods in optimization time window, $\lambda_k$ is the energy price of time period k, and $\Delta T$ is time step size. The charging/discharging power must be within the operating range considering both battery and energy conversion system power rating, $$-p_{max}^- \leq p_k \leq p_{max}^+ \quad (12)$$

where $p_{max}^-$ and $p_{max}^+$ are the maximum charging and discharging power of the BESS, respectively. The rate of change of energy stored in the BESS, $p_k^{batt}$, is related to charging/discharging power at the grid coupling point $P_k$ using the charging/discharging efficiencies as $$p_k^{batt} = \begin{cases} p_k / \eta^+ & \text{if } p_k \geq 0 \text{ (discharging)} \\ p_k \eta^- & \text{if } p_k \leq 0 \text{ (charging)} \end{cases} \quad (13)$$

where $\eta^+$ and $\eta^-$ are the discharging and charging efficiencies, respectively. The corresponding amount of energy changed inside the BESS can be calculated as $$\Delta e_k = p_k^{batt} \Delta T. \quad (14)$$

The change of SOC can be calculated as $$\Delta s_k = \Delta e_k / E_{max} \quad (15)$$

where $E_{max}$ is the rated energy capacity of the BESS. Finally, the dynamics of SOC can be expressed as $$s_{k+1} = s_k - \Delta s_k \quad (16)$$

where $S_k$ is the SOC level of the BESS at the end of time period k, and $\Delta e_k / E_{max}$ expresses the change of SOC during time period k. The SOC level is typically restricted to be between its lower and upper bounds as expressed in equation 17 below, either for safe operation of the BESS or to meet the specification from users.

$$\underline{S_k} \leq s_k \leq \overline{S_k} \quad (17)$$

With the objective function and various constraints, the optimization problem formulation for determining the optimal charging/discharging operation for energy arbitrage application in the conventional approach is as follows.

$$P_1: \max_{p_k, p_k^{max}, \Delta e, \Delta s_k, s_k} \sum_{k=1}^{K} \lambda_k p_k \Delta T \quad (18)$$

Equation 17 is subject to constraints from equations 12-17. The optimization problem $P_1$ can be converted to a standard linear programming problem to determine optimal charging/discharging operation.

In order to better explain the advantages of the novel described approaches, the same energy arbitrage application discussed above is again used as an example. In the conventional approach, the change of SOC with different charging/discharging power is estimated using battery rated capacity and constant charging/discharging efficiencies. Such a method is subject to several disadvantages and limitations. The energy that can be discharged or charged to battery depends on discharging/charging power. Using a single rated value $E_{max}$ for different power operations does not accurately model the capability of the BESS. The feasible charging/discharging power also depends on SOC. The BESS may not be able to be operated at any value within $[-p_{min}; p_{max}]$ for some SOC. The overall one way efficiencies of the BESS need to be estimated based on battery efficiency, inverter efficiency, power for auxiliaries etc. The estimation of each of these components requires approximation and introduces error which can be compounded. The charging/discharging efficiency also varies with BESS operation, which cannot be accurately modeled using constant efficiencies.

In order to overcome these limitations, an innovative optimal control approach is described here based on a general nonlinear BESS model (e.g., a performance model as described above with respect to FIGS. 1-10) to better estimate how different operation of a BESS affects its SOC level. Such a nonlinear model can be obtained by experimenting and operating a BESS under various conditions such as operating mode, power, SOC, and temperature. The change of SOC as a function of time for each operating conditions can be recorded. With the outputs, we the change of SOC as a function of operating conditions can be fit (charging/discharging power and SOC are considered here as example operating conditions).

$$\Delta s = f(p, s) \quad (19)$$

As an example, an experiment was conducted with a 1 MW/3.2 MWh vanadium redox BESS for an array of charging/discharging power, and the corresponding $\Delta s$ function was plotted. The plot indicates that the change of SOC rate varies with SOC level. At the same SOC level, different charging and discharging power also affects the change of SOC rate. Finally, some discharging power is not feasible even when there is energy left in the BESS. For example, the BESS cannot be discharged at 800 kW when SOC is lower than 43%. With the operating power range for different $S_k$ and $\Delta S$ functions either in the form of analytical expression or tables, the change of SOC in each time period can be related to the operating power and SOC, $$\Delta s_k = f(p_k, s_k) \cdot p_k \in \mathcal{P}_{s_k} \quad (20)$$

where $\mathcal{P}_{s_k}$ denotes the set of feasible operating power levels, which is affected by $S_k$. Note that the constant efficiency model represented by constraints from equations 12-15 can also be converted to the same form as equation 20. Therefore, a much simplified but general optimization problem can be formulated as follows:

$$P_2: \max_{p_k, \Delta s_k, s_k} \sum_{k=1}^{K} \lambda_k p_k \Delta T \quad (21)$$

subject to constraints from equations 20, 16, and 17. Such an approach removes the need to estimate the rated energy capacity and discharging/charging efficiencies and improves the modeling accuracy on how different charging/discharging operation affects SOC. The entire process of constructing the proposed nonlinear BESS model can be automated by programming the battery experiment and using scripts to process the recorded data. Compared with the previous optimization problem $P_1$, the formulation in the novel optimization problem $P_2$ better models the BESS operation. $P_2$, however, is more challenging to solve because it is generally a nonlinear and nonconvex optimization problem. One solution strategy is the enumeration method, but is generally computationally prohibitive. For example, with a 24 hour look-ahead window and 15 minute time step size, there are 96 time periods for which the BESS operation needs to be explored. If the feasible SOC range is discretized at each period into 100 values, the number of possible charging/discharging operation combination is 100⁹⁶, which is very large number of situations to analyze. The charging/discharging power limits can eliminate some infeasible combinations. Nevertheless, this still leaves a possible solution space with extremely high dimensionality.

Dynamic programing (DP) methods have many advantages over the enumeration scheme. In particular is the reduction in the dimensionality of the problem. With DP, infeasible combinations can be detected a priori, and information about previously investigated combinations can be used to eliminate inferior combinations. This significantly improves the efficiency. In a DP approach for battery optimal scheduling, the scheduling problem is first broken into stages, with each stage representing a scheduling period, e.g., 15 minutes. Each stage is divided into states. A state represents SOC level and encompasses the information required to go from one state on a stage to another state on the next stage. The power in the BESS and at the grid coupling point, as well as the corresponding cost/revenue can be determined for each transition between two states. The recursive algorithm to compute the maximum arbitrage value in stage k with state I is $$R(k+1, J) = \max_I [U(k, I; k+1, J) + R(k, I)] \quad (22)$$

where R(k+1, J) is the maximal arbitrage value at state (k+1, J), and U(k, I, k+1, J) is the energy revenue/cost associated with power discharging/charging operation that transits from state (k, I) to (k+1, J).

Case Study

The approaches described herein can be used in a diverse scope of applications for energy storage, such as energy arbitrage, regulation and load following services, Volt/Var control, load-shaping, outage mitigation, and deferment of distribution system upgrade. As a specific case study example, an energy arbitrage assessment was performed for Snohomish PUD in Washington State to demonstrate the significance of the described approaches. Snohomish PUD has been working to implement Modular Energy Storage Architecture (MESA), a set of nonproprietary design and connectivity standards that provide a scalable approach for energy storage control system integration and optimization. The MESA 2 BESS was used for this case study, which deploys two identical vanadium-flow battery assemblies having total combined ratings of 2 MW/6.4MWh.

While the BESS is capable of providing 6.4 MWh from fully charged to fully discharged, about 10.7 MWh is required to recharge the BESS, resulting in an average RTE equal to 0.6. The Mid-Columbia Hourly Index energy prices from 2011 to 2015 were obtained used for the arbitrage analysis in this case study. The optimal charging/discharging operation was determined using both 1) optimization problem $P_1$ with constant efficiency and discharging/charging power capability (conventional approach), and 2) optimization problem $P_2$ that reflects the novel approach using the nonlinear model (and as is described, for example, with reference to FIGS. 1-10). The estimated benefits using the described novel approach is much higher than conventional approach in all five years, and the difference is as large as 80% of the annual benefits from the existing method.

To understand the cause of the difference, the characteristics of BESS are further explored. The SOC change rate per 100 kW versus SOC for different charging/discharging power levels can be understood as an indicator that is equivalent to charging/discharging efficiency, and it tells how much SOC is reduced (or increased) to obtain 100 kW discharging (or charging) power for per unit time. For the MESA 2 BESS, charging (or discharging) at different power levels results in the same efficiency, which only varies with SOC. When discharging, the operable power capability also varies with SOC.

The marginal RTE at different SOC can be calculated as $$\eta(s) = \frac{r_{ch}(s)}{r_{disch}(s)} \quad (23)$$

where s denotes SOC level, $r_{ch}(s)$ and $r_{disch}(s)$ are the SOC change rate per 100 kW as a function of SOC for charging and discharging, respectively. As SOC increases from 20% to 100%, marginal RTE increases rapidly before 40%, reach the maximum around 50%-60%, and then decreases slightly after that. It is interesting to note that although cycling BESS from full to empty then to full results in an average RTE equal to 60%, BESS can be operated with a better efficiency when SOC is above 30%. Therefore, the optimization problem P1 (conventional approach) using a constant RTE of 60% underestimates the efficiency of BESS for many possible operations and leaves the BESS as standby for many time periods when arbitrage could be profitable.

Both approaches generate similar battery discharging and charging operation at the beginning and end of the sample period, because the price difference is big enough compared with RTE and energy arbitrage using BESS is profitable. However, the conventional approach outputs some infeasible operation. For example, the BESS is discharged at 2 MW from 7 to 9 a.m. and the SOC decreases from 100% to 20%. In fact, the BESS can only be discharged at this full power output within a very limited SOC range. For the other hours, the conventional approach leaves BESS as standby most of the time, because using a constant RTE of 60%, price difference is not big enough to recover 40% losses in energy arbitrage. On the other hand, the novel approaches described herein are capable of accurately exploring the BESS operating space at different operating power and SOC and takes into account the varying losses, finds profitable operation, and operates BESS in a higher efficiency region to maximize the benefits from energy arbitrage.

Example Computing Systems

Figure 11:
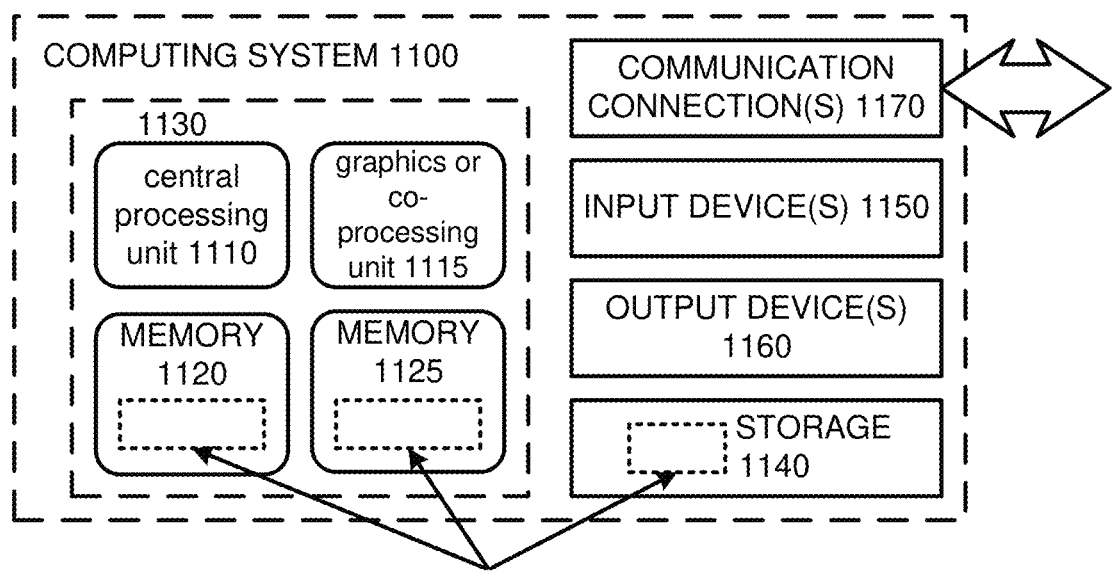
FIG. 11 is an example computing environment that can be used in conjunction with the technologies described herein.

FIG. 11 depicts a generalized example of a suitable computing system 1100 in which the described innovations may be implemented. The computing system 1100 is not intended to suggest any limitation as to scope of use or functionality, as the innovations may be implemented in diverse general-purpose or special-purpose computing systems.

With reference to FIG. 11, the computing system 1100 includes one or more processing units 1110, 1115 and memory 1120, 1125. In FIG. 11, this basic configuration 1130 is included within a dashed line. The processing units 1110, 1115 execute computer-executable instructions. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 11 shows a central processing unit 1110 as well as a graphics processing unit or co-processing unit 1115. The tangible memory 1120, 1125 may be volatile memory (e.g., registers, cache, RAM), non-volatile memory (e.g., ROM, EEPROM, flash memory, etc.), or some combination of the two, accessible by the processing unit(s). The memory 1120, 1125 stores software 1180 implementing one or more innovations described herein, in the form of computer-executable instructions suitable for execution by the processing unit(s). For example, memory 1120, 1125 can store curve generator 910 and performance modeler 912 of FIG. 9.

A computing system may have additional features. For example, the computing system 1100 includes storage 1140, one or more input devices 1150, one or more output devices 1160, and one or more communication connections 1170. An interconnection mechanism (not shown) such as a bus, controller, or network interconnects the components of the computing system 1100. Typically, operating system software (not shown) provides an operating environment for other software executing in the computing system 1100, and coordinates activities of the components of the computing system 1100.

The tangible storage 1140 may be removable or non-removable, and includes magnetic disks, magnetic tapes or cassettes, CD-ROMs, DVDs, or any other medium which can be used to store information and which can be accessed within the computing system 1100. The storage 1140 stores instructions for the software 1180 implementing one or more innovations described herein. For example, storage 1140 can store curve generator 910 and performance modeler 912 of FIG. 9.

The input device(s) 1150 may be a touch input device such as a keyboard, mouse, pen, or trackball, a voice input device, a scanning device, or another device that provides input to the computing system 100. For video encoding, the input device(s) 1150 may be a camera, video card, TV tuner card, or similar device that accepts video input in analog or digital form, or a CD-ROM or CD-RW that reads video samples into the computing system 1100. The output device(s) 1160 may be a display, printer, speaker, CD-writer, or another device that provides output from the computing system 1100.

The communication connection(s) 1170 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-executable instructions, such as those included in program modules, being executed in a computing system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media and executed on a computing device (e.g., any available computing device, including smart phones or other mobile devices that include computing hardware). Computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example and with reference to FIG. 11, computer-readable storage media include memory 1120 and 1125, and storage 1140. The term computer-readable storage media does not include signals and carrier waves. In addition, the term computer-readable storage media does not include communication connections (e.g., 1170).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology.

We claim:

1. A method, comprising:
    receiving battery data for a time period, the battery data representing actual performance of a battery system over the time period and including state-of-charge of the battery system;
    identifying sub-periods of charging or discharging in the time period;
    for at least one of the respective sub-periods of time, determining a function that represents how a rate-of-change of the state-of-charge of the battery system with respect to time varies with the state-of-charge of the battery system;

based at least in part on the functions determined for the respective sub-periods of time, determining an expected performance of the battery system at a plurality of states-of-charge; and transmitting operating instructions for the battery system based on the expected performance.

2. The method of claim 1, wherein the expected performance of the battery system is determined without accounting for a battery type of batteries in the battery system.

3. The method of claim 1, wherein the battery data further comprises, for a plurality of times within the time period, at least one of: operating mode, output power, input power, or operating temperature.

4. The method of claim 1, wherein the sub-periods of charging or discharging are sub-periods over which a rate of charging or discharging varies less than a threshold amount.

5. The method of claim 4, wherein the threshold amount is 10 percent of an initial rate of charging or discharging.

6. The method of claim 1, wherein the sub-periods of charging or discharging are sub-periods over which at least one of: the state-of-charge of the battery system changes more than a threshold amount or a time threshold is exceeded.

7. The method of claim 6, wherein the threshold amount is 25 percent of an initial state-of-charge of the battery system.

8. The method of claim 1, further comprising prior to fitting the curve to the battery data for the respective sub-periods of time, smoothing the battery data for the respective sub-periods of time.

9. The method of claim 1, wherein determining the expected performance of the battery system comprises generating a performance model of how the rate of change of the state-of-charge of the battery system with respect to time varies with respect to at least one of: output power, input power, operating temperature, or the state-of-charge of the battery system.

10. The method of claim 9, wherein the performance model comprises a taper parameter reflecting a state-of-charge of the battery system below which, for particular output powers and operating temperatures, a drop in output power exceeds a threshold.

11. The method of claim 1, further comprising after transmitting the operating instructions:
receiving additional battery data;
updating the expected performance of the battery system based on the additional battery data; and
transmitting updated operating instructions for the battery system.

12. The method of claim 1, wherein the operating instructions specify at least one of: one or more states-of-charge of the battery system below which tapering occurs; one or more preferred operating temperatures or preferred output or input powers; a time over which the battery system is capable of providing a desired power for a particular initial state-of-charge of the battery system; or performance model parameters.

13. A system, comprising:
at least one processor;
memory storing computer-executable instructions that when executed by the at least one processor, cause the at least one processor to:
receive battery data for a time period, the battery data representing actual performance of a battery system over the time period and including state-of-charge of the battery system;

identify sub-periods of charging or discharging in the time period;
for at least one of the respective sub-periods of time, determine a function that represents how a rate-of-change of the state-of-charge of the battery system with respect to time varies with the state-of-charge of the battery system; and
determine an expected performance of the battery system at the plurality of states-of-charge based at least in part on the functions determined for the respective sub-periods of time.

14. The system of claim 13, wherein the computer-executable instructions further comprise computer-executable instructions that when executed by the at least one processor, cause the at least one processor to:
determine operating instructions for the battery system based at least in part on the expected performance of the battery system; and
transmit the operating instructions for the battery system to a battery system management computing device.

15. The system of claim 14, wherein the operating instructions for the battery system specify a range of states-of-charge of the battery system over which a desired output power can be maintained.

16. They system of claim 13, wherein determining the expected performance of the battery system comprises generating a performance model of how the rate of change of the state-of-charge of the battery system with respect to time varies with respect to the state-of-charge of the battery system.

17. The system of claim 13, wherein the functions for the respective sub-periods are expressed as:

$$\frac{dSOC}{dt} = a(SOC - b)^c,$$

wherein a, b, and c are constants determined through a curve-fitting process.

18. One or more non-transitory computer-readable media storing computer-executable instructions that when executed by a controller, cause the controller to perform a method of managing operation of a battery system, the managing comprising:
identifying, in battery data representing actual performance of a battery system over a time period, sub-periods of charging or discharging in the time period, wherein the battery data comprises state-of-charge of the battery system for a plurality of times within the time period;
for the respective sub-periods of time, fitting a curve to the battery data corresponding to the time sub-period, the curve representing how a rate-of-change of the state-of-charge of the battery system with respect to time varies with the state-of-charge of the battery system;
generating a performance model for the battery system using the curves for the respective sub-periods of time; and
generating operating instructions for the battery system using the performance model.

19. The non-transitory computer-readable media of claim 18, wherein the operating instructions are based at least in part on an expected use of the battery system, and wherein the operating instructions specify a range of states-of-charge of the battery system over which a desired output power can be maintained for the expected use of the battery system.

20. The non-transitory computer-readable media of claim 18, wherein the managing further comprises transmitting the operating instructions to a battery system management computing device comprising the controller and being associated with the battery system.

* * * * *